United States Patent [19]

Michel et al.

[11] 4,019,064
[45] Apr. 19, 1977

[54] HIGH INTENSITY IONIC BOMBARDMENT REACTOR FOR THERMOCHEMICAL TREATMENT PROCESSES

[76] Inventors: Henri Michel, 10 impasse des Acacias, Jarville (Meurthe & Moselle); Michel Gantois, 63 rue Charles Gounod, Vandoeuvre (Meurthe & Moselle), both of France

[22] Filed: Mar. 17, 1975

[21] Appl. No.: 558,896

[30] Foreign Application Priority Data

Mar. 19, 1974  France ............................ 74.09227

[52] U.S. Cl. ............................ 250/543; 148/16.5; 148/16.6; 204/164; 204/165; 250/531; 250/542
[51] Int. Cl.² ...................... B01K 1/00; C21D 1/00
[58] Field of Search ............... 13/9; 148/16.5, 16.6; 204/164, 165; 250/531, 542–547

[56] References Cited

UNITED STATES PATENTS

| | | | |
|---|---|---|---|
| 3,282,814 | 11/1966 | Berghaus | 204/192 |
| 3,503,711 | 3/1970 | Skala | 23/232 |
| 3,536,602 | 10/1970 | Jones et al. | 204/164 |
| 3,594,302 | 7/1971 | Rordorf | 250/531 |
| 3,730,863 | 5/1973 | Keller | 204/164 |
| 3,828,162 | 8/1974 | Holden | 219/383 |
| 3,840,750 | 10/1974 | Davis et al. | 250/547 |

*Primary Examiner*—F.C. Edmundson

[57] ABSTRACT

A high intensity ionic bombardment reactor for submitting a member to a thermochemical treatment process of the type comprising a current duct or conductor forming a support for said member and having the form of a cylindrical metal rod, and an insulant for insulating said conductor from the reactor walls, said reactor further comprising a tube supported by said insulant coaxially surrounding said rod and spaced therefrom by a constant distance which is as small as possible.

3 Claims, 1 Drawing Figure

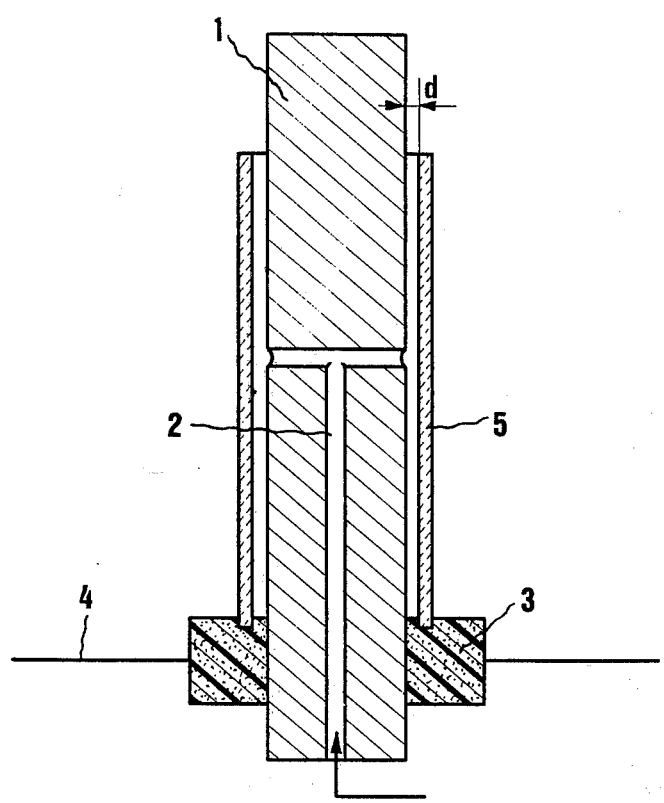

HIGH INTENSITY IONIC BOMBARDMENT REACTOR FOR THERMOCHEMICAL TREATMENT PROCESSES

The high temperature surface reactions obtained under the action of a high intensity ionic bombardment are generally performed in a metal reactor.

In the enclosure called a reactor, where the reactive gas pressure is between 0.1 and 15 torr, a potential difference of a few hundred volts is applied between the metal sample to be treated, acting as the cathode, and the reactor walls, acting as the anode. This leads to a discharge with so-called "abnormal" characteristics with a very high intensity (up to 1000 A). In the dark field (or cathode drop area), in the immediate vicinity of the cathode, the ions formed are accelerated towards the latter.

All parts of the apparatus at cathode potential are heated by absorbing the kinetic energy of the bombardment and the surface-absorbed ions react chemically with the substrate.

The cathode is supplied with electric power by one or several current inputs which can moreover serve as load supports, no matter whether the load is set down or suspended.

The current inputs must be electrically insulated from the reactor wall which is at anode potential because the electrical conductor is at cathode potential.

Experience has shown that the very high power levels normally used lead to rapid deterioration of the current ducts within the enclosure, level with the areas of contact between conductor and insulant. (These areas are in fact the preferred areas for short-circuits with or without spark breakdown).

The use of a support made from insulating material or a current duct covered entirely with insulating material has on the one hand the disadvantage of being fragile and on the other it only partly solves the problem due to their progressive metallization by cathode sputtering which rapidly make them conductive.

The object of the present invention is to eliminate discharges level with the areas of contact between conductor and insulant, thereby preventing deterioration of the current ducts.

To achieve this object the invention is based on the fact that, as stated hereinbefore, it is in the immediate vicinity of the cathode in the dark field at a distance, which will be called $\delta$, at which the potential drop occurs and the ions are accelerated towards the cathode. Thus, if a shield is placed at a distance less than $\delta$ from the cathode, the building-up of the discharge is no longer possible.

Consequently the reactor according to the invention, which comprises a current duct or conductor forming a support for the member to be treated in the form of a cylindrical metal rod and an insulant permitting the insulation of the conductor from the reactor walls, has a tube supported by the insulant coaxially surrounding the said rod and spaced therefrom by a constant distance which is as small as possible in view of the constructional requirements.

It is known that $\delta$ is dependent on the pressure in the reactor and that it decreases when the pressure increases. Consequently for a given distance $d$ between the conductor and the tube forming the shield, the gas pressure in the reactor must be limited to the pressure value corresponding to a dark field dimension $\delta$ equal to distance $d$. If the pressure exceeds this limit a discharge occurs and the reactor no longer functions because it is short-circuited.

As has been shown it is important for the distance $d$ to be kept as small as possible.

To enable the reactor to operate at higher pressures at least one reactive gas circulation duct is provided in the said rod and issues into the space between the rod and the tube.

In a first reactor operating method, reactive gas is blown into the reactor via the duct provided in the rod and the gas flow is regulated in such a way that the dynamic pressure in the said space is higher than the maximum discharge building-up pressure between rod and tube.

As the gas flow is regulated in such a way that the pressure in the space is higher than the maximum discharge building-up pressure under the reactor operating conditions, no discharge occurs. In the absence of this introduction of gas the pressure in the space would become equal to the average pressure of the enclosure and a discharge would occur.

In a second reactor operating method the reactive gas is drawn towards the outside via the duct in the rod, whereby flow regulation is such that the dynamic pressure in the said space is less than the pressure corresponding to a dark field dimension equal to the distance between rod and tube. The gas flow and therefore the dynamic pressure in the space is regulated in such a way that the dark field dimension $\delta$, which is a function of this pressure assumes a value greater than the distance $d$ between conductor and tube, so that the building-up of discharges between conductor and tube, even at high pressures is avoided. Thus, from the standpoint of the discharge everything happens as if the pressure in the enclosure was equal to the dynamic pressure in the space and therefore dropped below the limit value for the pressure defined hereinbefore.

The invention will be better understood from reading the following description with reference to the attached DRAWING which shows an axial section of the apparatus according to the invention.

The conductor comprises a metal rod 1 whose cross-section is such that it will support the (not shown) member to be treated and which supplies the said member with electric power to bring it to cathode potential.

The rod 1 contains a system of ducts 2 permitting the circulation of the reactive gas, either in the direction in which it is introduced into the reactor, as shown by the arrow, or in the discharge direction.

The rod 1 is insulated from the reactor wall 4, which is at anode potential, by an insulant 3 of cement or refractory insulating materials, whereby a system of not shown joints ensures sealing relative to vacuum. Insulant 3 carries a tube 5 made either from an insulating material such as glass, oxides, etc. or a conductive material e.g. a metal, whereby tube 5 is mounted coaxially relative to rod 1 and defines a space between rod and tube. The distance $d$ between rod 1 and tube 5 is kept constant by constructional measures.

In the absence of gas circulation, distance $d$ must always be less than the dark field dimension $\delta$, the dark field being the area adjacent to the member to be treated where the potential drop occurs and where the ions are formed and accelerated on the member to be treated and serving as the cathode.

Dimension $\delta$ decreases considerably when the pressure in the reactor rises. As an order of magnitude it is about 5 mm for a pressure of 3 mm Hg and 0.1 mm for a pressure of 10 mm Hg.

Therefore tube 5 cannot perform its shield function and prevents the building-up of the discharge if the pressure remains less than the pressure corresponding to a dimension δ equal to $d$. If the pressure exceeds this value the dark field dimension δ drops below $d$ and a discharge occurs leading to the short-circuiting of the reactor, which prevents its operation.

Under these conditions the reactor can operate up to a pressure of about 5 mm Hg, whereby δ is then about 0.2 mm. For higher pressures δ decreases and it becomes very difficult to regulate the distance $d$ to such a small value.

The circulation of reactive pressure through ducts 2 makes it possible to operate the reactor at higher pressures.

A first possibility consists in introducing gas into the reactor in the direction of the arrow, whereby the dynamic pressure in space between rod 1 and tube 5 is higher than the average pressure in the enclosure. The gas flow is regulated in such a way that this dynamic pressure is higher than the maximum discharge building-up pressure. It is thus possible to perform a treatment in the reactor at high pressures in excess of the limit pressure indicated hereinbefore with no danger of a discharge taking place.

The introduction of gas via ducts 2 also provides the advantage of preventing any accumulation, in the space between rod 1 and tube 5 of cathode sputtering products and moreover the gas heats before entering the enclosure and simultaneously cools rod 1, which is very favourable for the overall efficiency of the installation and the homogeneity of the treatment.

The other possibility consists in drawing the gas from within the reactor and passing it to the outside via ducts 2.

Thus, the dynamic pressure in space 6 is well below the average pressure in the enclosure. The dynamic pressure is regulated so that the dark field dimension δ corresponding thereto exceeds distance $d$. Thus, a value can be chosen for $d$ which is such that the machining of the refractory members and the centering of the insulating and conducting members cause no problems, e.g. 0.5 mm, whilst performing the treatment at high pressures.

This apparatus operating with gas circulation offers the advantage of great simplicity of construction and considerable robustness, whilst being remarkably reliable.

What we claim is:

1. In a high intensity ionic bombardment reactor for submitting an object to thermochemical treatment with a reactive treatment gas in which the interior surface of said reactor is at anodic potential with a cylindrical metal rod at cathodic potential insulatedly disposed on the surface of the reactor, said rod being operative to support said object, the improvement comprising a cylindrical tube insulatedly disposed on said reactor surface coaxially with and surrounding a portion of said rod, the interior of said tube being spaced from said rod at a constant distance which is as small as possible and less than the dark field dimension δ, said rod including at least one gas circulating duct communicating with the exterior of the reactor and the space between said rod and said tube and operable to convey said gas to or from said reactor so as to maintain a dynamic pressure in the space between said rod and said tube, which pressure is higher or lower, respectively, then the average pressure in said reactor.

2. A reactor according to claim 1 including means for introducing reactive gas into the reactor through said duct at such a pressure that the dynamic pressure in the space between said rod and said tube is higher than the maximum discharge building-up pressure between said rod and said tube.

3. A reactor according to claim 1 including means for removing reactive gas from said reactor through said duct such that the dynamic pressure in the space between said rod and said tube is less than that pressure at which the dark field dimension equals the distance of the space between said rod and said tube.

* * * * *